(12) United States Patent
Vittu

(10) Patent No.: US 6,787,869 B1
(45) Date of Patent: Sep. 7, 2004

(54) OPTICAL SEMICONDUCTOR HOUSING AND METHOD FOR MAKING SAME

(75) Inventor: Julien Vittu, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/129,312

(22) PCT Filed: Oct. 30, 2000

(86) PCT No.: PCT/FR00/03020

§ 371 (c)(1),
(2), (4) Date: Sep. 20, 2002

(87) PCT Pub. No.: WO01/33635

PCT Pub. Date: May 10, 2001

(30) Foreign Application Priority Data

Nov. 4, 1999 (FR) .............................. 99 13776

(51) Int. Cl.⁷ .......................................... H01L 31/0203
(52) U.S. Cl. ...................... 257/434; 257/432; 257/433; 257/777; 257/780; 257/778; 257/779
(58) Field of Search ...................... 257/434, 432–433, 257/777–780

(56) References Cited

U.S. PATENT DOCUMENTS 5,357,056 A * 10/1994 Nagano ..................... 174/52.4
5,867,368 A * 2/1999 Glenn ......................... 361/783
5,962,810 A * 10/1999 Glenn ......................... 174/52.2

* cited by examiner

Primary Examiner—Luan Thai
(74) Attorney, Agent, or Firm—Lisa K. Jorgenson; Jose Gutman; Fleit, Kain, Gibbons, Gutman, Bongini & Bianco P.L.

(57) ABSTRACT

Optical semiconductor package (10) and process for fabricating an optical semiconductor package, in which an electrical connection support plate has a through-passage (37); a semiconductor component (34), a front face (33) of which has an optical sensor and which is fixed to a rear face of the plate in such a way that its optical sensor is situated opposite the through-passage; electrical connection (38) connects the optical component to the support plate; the component is encapsulated on the rear face of the support plate; a lid (50), which is at least partially transparent, is fixed to a front face of the support plate and covers the through-passage; and external electrical connections (51) are located on an exposed part of the support plate. Furthermore, another semiconductor component (41) may be fixed to the rear face of the support plate (43) and electrically connected, to the latter, this component also being encapsulated (49).

14 Claims, 4 Drawing Sheets

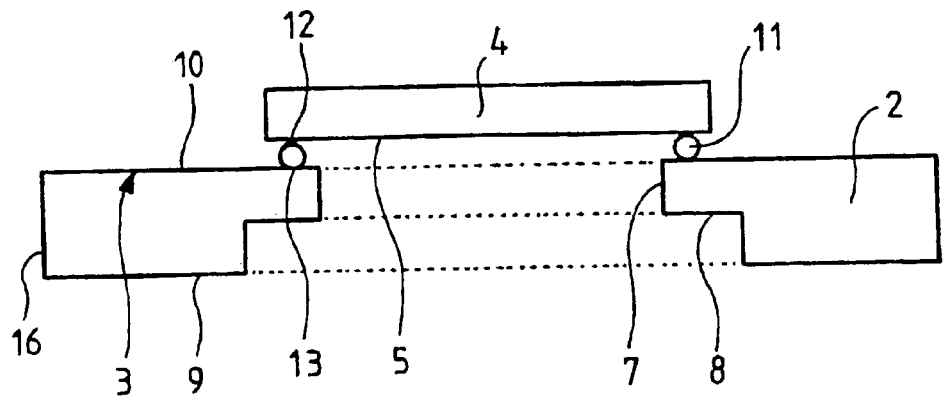
FIG_1
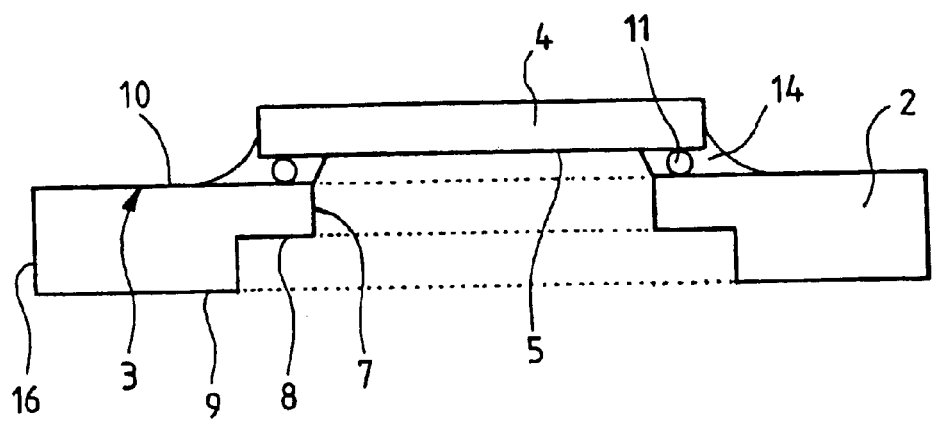
FIG_2
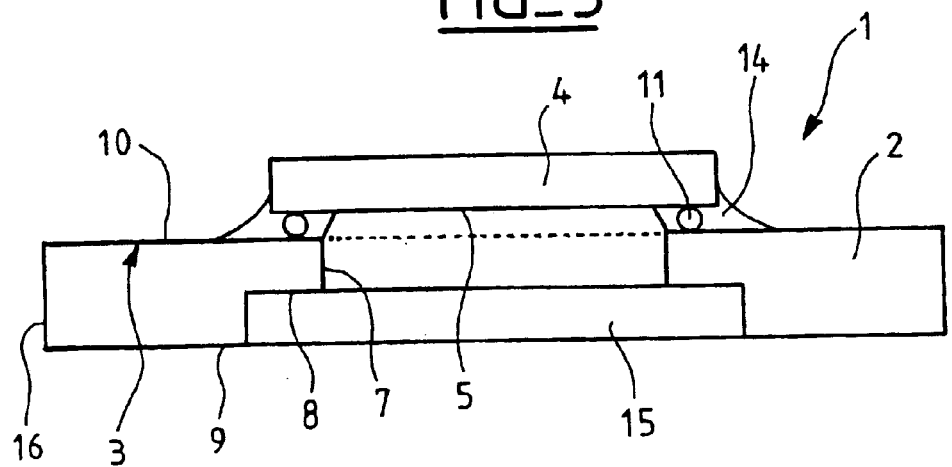
FIG_3

FIG_4
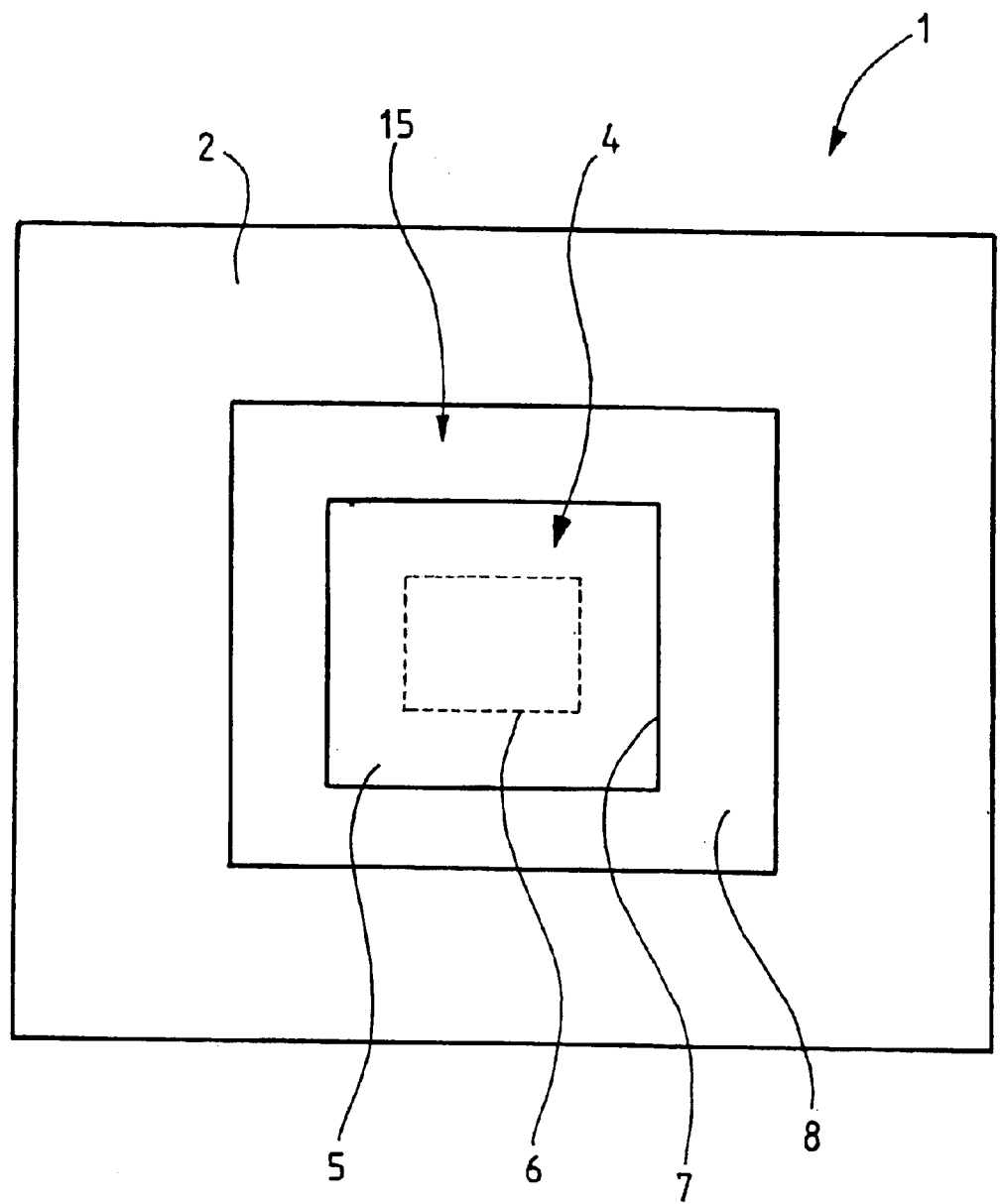

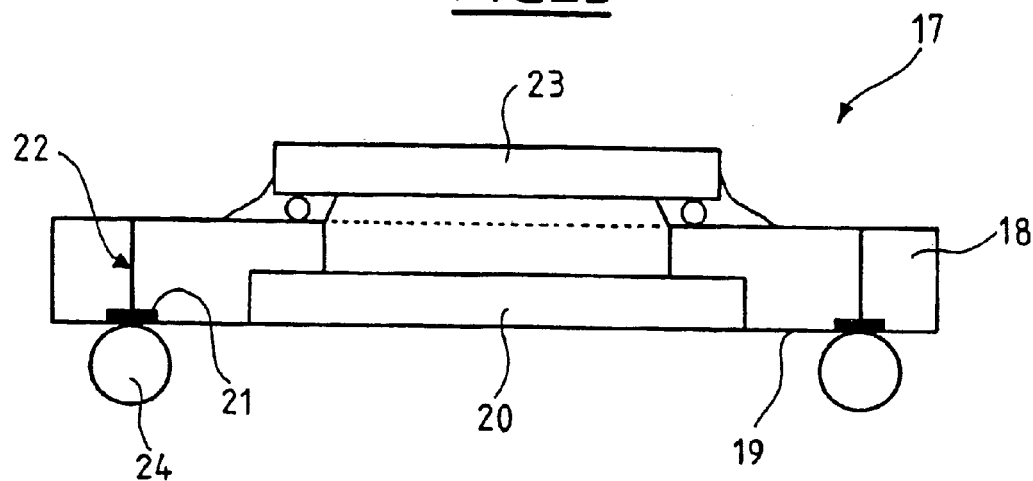
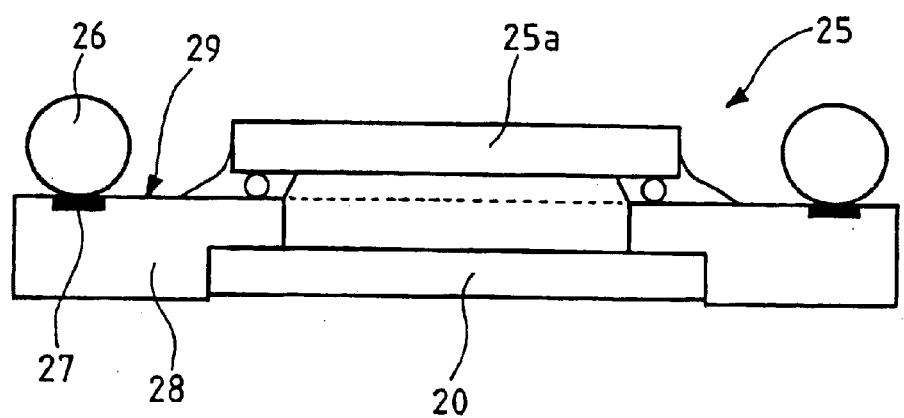
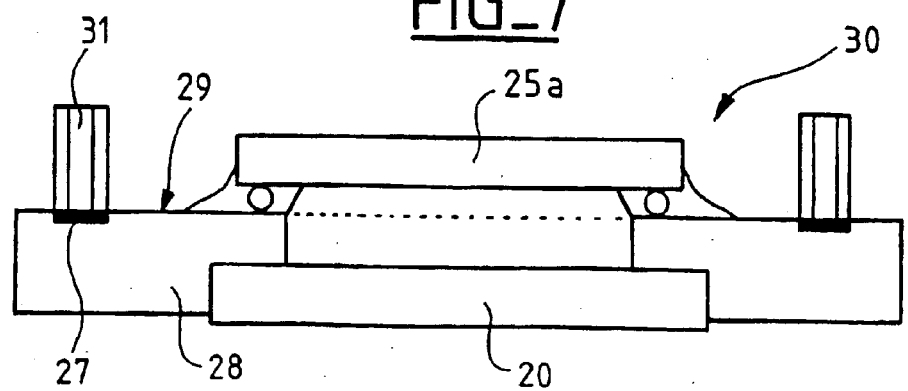

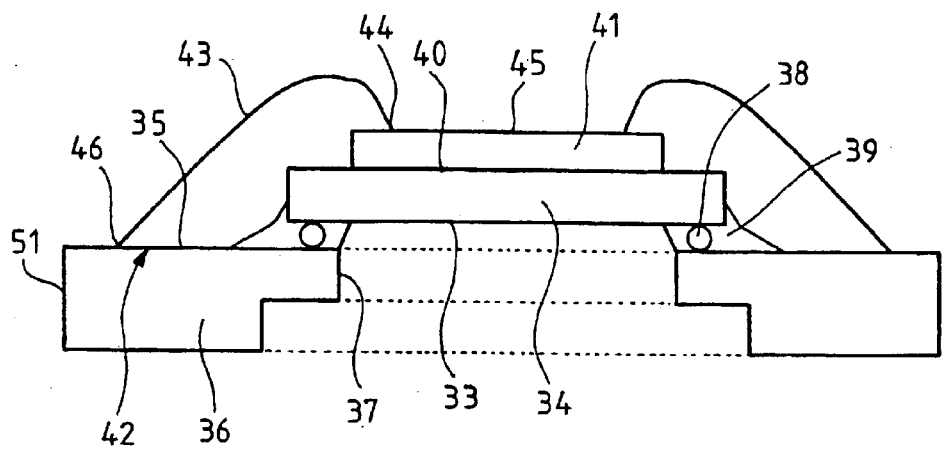
FIG_8
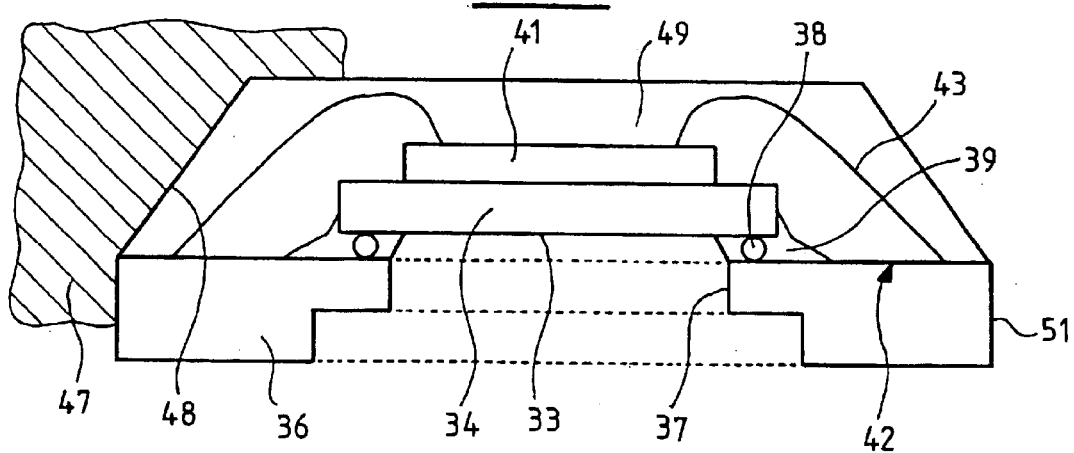
FIG_9
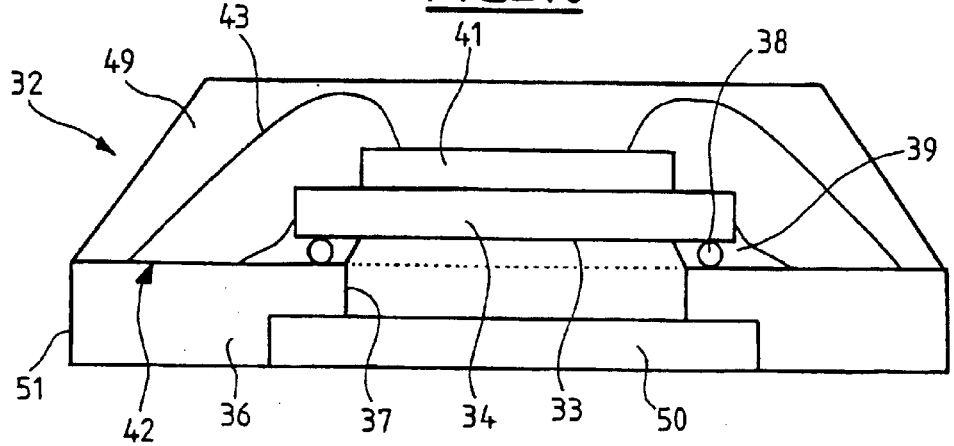
FIG_10

OPTICAL SEMICONDUCTOR HOUSING AND METHOD FOR MAKING SAME

The present invention relates to an optical semiconductor package and to a process for fabricating such a package.

The object of the present invention is to provide a structure for an optical semiconductor package comprising several semiconductor components and a process for fabricating such a package in such a way that this package has a small footprint and is capable of being used immediately, preferably to deliver image data from the data arising from a semiconductor component with an optical sensor.

According to one subject of the present invention, the optical semiconductor package comprises an electrical connection support plate which has a through-passage; a semiconductor component, a front face of which has an optical sensor and which is fixed to a rear face of the said plate in such a way that its optical sensor is situated opposite the said through-passage; means of electrical connection of the said optical component to the said support plate; means of encapsulation of the said component on the rear face of the said support plate; a lid, which is at least partly transparent, fixed to a front face of the said support plate and covering the said through-passage; and external electrical connection means located on an exposed part of the said support plate.

According to a preferred embodiment of the invention, the said component is fixed and electrically connected to the said support plate by connection balls located between the front face of the said component and the rear face of the said support plate and the said encapsulation means comprise an encapsulation material enveloping the said balls and lying between the front face of the said component and the rear face of the said support plate.

According to the present invention, the package may advantageously comprise a second semiconductor component, such as a microprocessor, a front face of which is fixed to a rear face of the said optical component, means of electrical connection of this second component to the said support plate and means of encapsulation of the said components stacked on the rear face of the said support plate.

According to the invention, the said means of electrical connection of this second component to the said support plate preferably comprise electrical wires.

According to the invention, the said encapsulation means preferably comprise an encapsulation material for the said components.

According to the invention, the said external electrical connection means preferably comprise metal regions made on the surface of the said support plate.

According to the invention, the said external electrical connection means preferably comprise connection balls placed on the said metal regions.

According to the invention, the said external electrical connection means preferably comprise connection columns.

According to the invention, the peripheral edge of the said lid is preferably engaged in an annular hollow surrounding the said through-passage.

According to another subject of the present invention, the process for fabricating an optical semiconductor package consists in making a through-passage through an electrical connection support plate comprising external electrical connection means; fixing a front face of a semiconductor component to a rear face of the said support plate, this component having an optical sensor on its front face, in such a way that its optical sensor is situated opposite the said through-passage; and electrically connecting the said optical component to the said support plate; encapsulating the said component on the rear face of the said support plate; and fixing a lid, which is at least partially transparent, to a front face of the said support plate in such a way that this lid covers the said through-passage.

According to the present invention, the process may in addition consist in fixing a second component to the rear face of the said optical component; electrically connecting the said second component to the said support plate; and encapsulating the said second component on the rear face of the said support plate.

The present invention will be better understood by studying an optical semiconductor package and its fabrication process, described by way of non-limiting examples and illustrated by the drawings in which:

FIG. 1 shows a side view of a first stage in the fabrication of a package according to the present invention;

FIG. 2 shows a second stage in the fabrication of the said package;

FIG. 3 shows a third stage in the fabrication of the said package;

FIG. 4 shows an end-on view of the said package;

FIG. 5 shows a fourth stage in the fabrication of an alternative embodiment of the said package;

FIG. 6 shows a fourth stage in the fabrication of an alternative embodiment of the said package;

FIG. 7 shows a fourth stage in the fabrication of an alternative embodiment of the said package;

FIG. 8 shows a third stage in the fabrication of an alternative embodiment of the said package;

FIG. 9 shows a fourth stage in the fabrication of the package of FIG. 8; and

FIG. 10 shows a fifth stage in the fabrication of the package of FIG. 8.

With reference to FIGS. 1 to 4, the various stages in the fabrication of an optical semiconductor package, denoted overall by the reference 1 and shown completed in FIGS. 3 an 4, will firstly be described.

FIG. 1 shows a prefabricated substrate 2 formed by a support plate which has internal and/or external lines forming an electrical connection network 3 and shows a semiconductor component 4 which has an optical sensor 6 in the central part of its front face.

The support plate 2 has a through-passage 7 and an annular hollow or countersink 8 made around the through-passage 7 and in its front face 9.

In a first stage of fabrication, the front face 5 of the optical component 4 is fixed and electrically connected to the rear face 10 of the support plate 2 via a multiplicity of distributed metal balls 11 which are inserted between, on one hand, electrical connection metal pads 12 made on the surface of the front face 5 of the optical component 4, between its central part 6 and its peripheral edge and, on the other hand, metal connection pads 13 made on the surface of the rear face 10 of the support plate 2, external to its through-passage 7, the optical component 4 being located in such a way that its optical sensor 6 is placed opposite the through-passage 7 of the support plate 2.

In a second stage of fabrication shown in FIG. 2, the component 4 is encapsulated on the rear face 10 of the support plate 2, by filling the annular space separating the front face 5 of the optical component 4 and the rear face 10 of the support plate 2 with an encapsulating and sealing material 14 in which the connection balls 11 are embedded.

In a third stage of fabrication shown in FIG. 3, a flat front lid 15, made from a transparent material, is fitted in the through-passage 7 of the support plate 2 in such a way that its peripheral edge is engaged in its annular hollow 8, the peripheral edge of this lid 15 being fixed in this hollow 8 via a layer of adhesive.

The support plate 2 is previously provided on its peripheral rim with surface metal regions 16 connected to its electrical connection network 3, these metal regions 16 forming means of external electrical connection of the optical component 4 through the support plate 2.

In this way, as shown in FIGS. 3 and 4, a sealed optical semiconductor package 1 is obtained, fitted with an optical semiconductor component 4 capable of being connected to an external circuit using the metal regions 16.

FIG. 5 shows a package 17 which differs from the package 1 of FIG. 3 only in the fact that its support plate 18 has on its front face 19, around its front lid 20, electrical connection metal regions 21 connected to its electrical connection network 22 of its optical component 23, and on which external electrical connection metal balls 24 are deposited, in a fourth stage of fabrication.

The package 25 shown in FIG. 6 is an alternative embodiment of the package 17 of FIG. 5, which differs from it by the fact that its external electrical connection metal balls 26 are placed on metal pads 27 of its support plate 28, which are provided on the rear face 29 of the latter, around and some distance from its optical component 23.

The package 30 shown in FIG. 7 differs from the package 25 of FIG. 6 only by the fact that the metal balls 26 are replaced with external electrical connection columns 31 which are electrically connected to the metal pads 27.

With reference to FIGS. 8 to 10, the various stages in the fabrication of another optical semiconductor package, denoted overall by the reference 32 and shown completed in FIG. 10, will now be described.

In a first stage of fabrication identical to that previously outlined with reference to FIG. 1, the front face 33 of an optical component 34 is fixed and electrically connected to the rear face 35 of a support plate 36 having a central passage. 37 via connection balls 38.

Then, in a second stage of fabrication identical to that previously outlined with reference to FIG. 2, the annular space containing the balls 38 is filled by an encapsulation material 39.

In a third stage of fabrication shown in FIG. 8, a semiconductor component 41, such as a microprocessor or coprocessor, is fixed to the rear face 40 of the optical component 34 via a layer of adhesive or any other means.

Then, the component 41 is electrically connected to the electrical connection network 42 of the support plate 36 by fixing one of the ends of electrical connection wires 43 to metal pads 44 formed on the surface on the rear face 45 of the component 41 and by fixing the other end of the electrical connection wires 43 to metal pads 46 of the network 42, which are formed on the surface on the rear face 35 of the support plate 36.

In a third stage of fabrication shown in FIG. 9, the assembly as mounted of FIG. 8 is fitted into a mould 47 which has a cavity 48 enveloping at some distance the components 34 and 41 and the electrical connection wires 43.

Next, an encapsulation material is injected into the cavity 48 so as to form a block 49 at the back of the rear face 35 of the support plate 36 in which the components 34 and 41 and the electrical connection wires 43 are embedded. Then, the moulding is removed.

In a fourth stage of fabrication shown in FIG. 10, a lid 50 is fitted into the passage 37 as described previously with reference to FIG. 3.

The support plate 36 of the package 32 is provided, like that of FIG. 3, with external electrical connection metal regions 51.

In this way, as shown in FIG. 10, a complete optical semiconductor package 32 is obtained, fitted with an optical semiconductor component 19 and a coprocessor, both electrically connected in an appropriate way via the electrical connection network 42 of the support plate 1 and both capable of being connected to an external circuit using the metal regions 51.

Of course, the external connection metal regions 51 could be replaced with external electrical connection columns or metal balls as proposed with reference to FIGS. 5 to 7.

The present invention is not limited to the examples described hereinbefore. Many alternative embodiments are possible without departing from the framework defined by the appended claims.

What is claimed is:

1. An optical semiconductor package comprising:
   an electrical connection support plate that has a through-passage;
   a semiconductor component, a front face of which has an optical sensor and which is fixed to a rear face of the plate in such a way that its optical sensor is situated opposite the through-passage;
   means of electrical connection of the optical component to the support plate;
   means of encapsulation of the component on the rear face of the support plate;
   a lid, which is at least partly transparent, fixed to a front face of the support plate and covering the through-passage;
   external electrical connection means located on an exposed part of the support plate;
   a second semiconductor component, such as a microprocessor, a front face of which is fixed to a rear face of the optical component;
   means of electrical connection of this second component to the support plate; and
   means of encapsulation of the components stacked on the rear face of the support plate.

2. The optical semiconductor package according to claim 1, wherein the external electrical connection means comprises metal regions made on the surface of the support plate.

3. The optical semiconductor package according to claim 2, wherein the external electrical connection means comprises connection balls placed on the metal regions.

4. The optical semiconductor package according to claim 1, wherein the peripheral edge of the lid is engaged into an annular hollow surrounding the through-passage.

5. The optical semiconductor package according to claim 1, wherein the semiconductor component is fixed and electrically connected to the support plate by connection balls located between the front face of the component and the rear face of the support plate and that the encapsulation means comprise an encapsulation material enveloping the balls and lying between the front face of the component and the rear face of the support plate.

6. The optical semiconductor package according to claim 1, wherein the means of electrical connection of this second component to the support plate comprises electrical wires.

7. The optical semiconductor package according to claim 1, wherein the encapsulation means comprises an encapsulation material for the components.

8. An information processing system comprising:
   at least one optical semiconductor package, each of the at least one optical semiconductor package comprising:

an electrical connection support plate that has a through-passage;

a semiconductor component, a front face of which has an optical sensor and which is fixed to a rear face of the plate in such a way that its optical sensor is situated opposite the through-passage;

means of electrical connection of the optical component to the support plate;

means of encapsulation of the component on the rear face of the support plate;

a lid, which is at least partly transparent, fixed to a front face of the support plate and covering the through-passage;

external electrical connection means located on an exposed part of the support plate;

a second semiconductor component, such as a microprocessor, a front face of which is fixed to a rear face of the optical component;

means of electrical connection of this second component to the support plate; and means of encapsulation of the components stacked on the rear face of the support plate.

9. The information processing system according to claim 8, wherein the external electrical connection means comprises metal regions made on the surface of the support plate.

10. The information processing system according to claim 9, wherein the external electrical connection means comprises connection balls placed on the metal regions.

11. The information processing system according to claim 8, wherein the peripheral edge of the lid is engaged into an annular hollow surrounding the through-passage.

12. The information processing system according to claim 8, wherein the semiconductor component is fixed and electrically connected to the support plate by connection balls located between the front face of the component and the rear face of the support plate and that the encapsulation means comprise an encapsulation material enveloping the balls and lying between the front face of the component and the rear face of the support plate.

13. The information processing system according to claim 8, wherein the means of electrical connection of the second component to the support plate comprises electrical wires.

14. The information processing system according to claim 8, wherein the encapsulation means comprises an encapsulation material for the components.

* * * * *